(12) United States Patent
Wang et al.

(10) Patent No.: US 11,127,809 B2
(45) Date of Patent: Sep. 21, 2021

(54) STRETCHABLE DISPLAY PANEL, STRETCHABLE DISPLAY APPARATUS, AND METHOD OF FABRICATING STRETCHABLE DISPLAY PANEL

(71) Applicant: BOE Technology Group Co., Ltd., Beijing (CN)

(72) Inventors: Pinfan Wang, Beijing (CN); Song Zhang, Beijing (CN); Mingche Hsieh, Beijing (CN); Fangxu Cao, Beijing (CN); Chunyan Xie, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 62 days.

(21) Appl. No.: 16/632,200

(22) PCT Filed: Dec. 5, 2018

(86) PCT No.: PCT/CN2018/119331
§ 371 (c)(1),
(2) Date: Jan. 17, 2020

(87) PCT Pub. No.: WO2020/113457
PCT Pub. Date: Jun. 11, 2020

(65) Prior Publication Data
US 2021/0225984 A1 Jul. 22, 2021

(51) Int. Cl.
*H01L 27/32* (2006.01)
*H01L 51/00* (2006.01)
(Continued)

(52) U.S. Cl.
CPC ...... *H01L 27/3276* (2013.01); *H01L 27/3211* (2013.01); *H01L 27/3246* (2013.01);
(Continued)

(58) Field of Classification Search
CPC ............. H01L 27/3276; H01L 27/3211; H01L 27/3246; H01L 51/0097; H01L 51/5253; H01L 51/56; H01L 2227/323
(Continued)

(56) References Cited

U.S. PATENT DOCUMENTS 9,799,708 B2  10/2017  Hong et al.
2016/0049602 A1  2/2016  Kim
(Continued)

FOREIGN PATENT DOCUMENTS

CN  107195667 A  9/2017
CN  107450772 A  12/2017
(Continued)

OTHER PUBLICATIONS

International Search Report & Written Opinion dated Aug. 28, 2019, regarding PCT/CN2018/119331.

*Primary Examiner* — Dzung Tran
(74) *Attorney, Agent, or Firm* — Intellectual Valley Law, P.C.

(57) ABSTRACT

A stretchable display panel having a plurality of encapsulated islands and a plurality of bridges connecting the plurality of encapsulated islands. The stretchable display panel includes a plurality of light emitting elements. A respective one of the plurality of encapsulated islands includes at least one of the plurality of light emitting elements encapsulated therein on a base substrate. A respective one of the plurality of light emitting elements includes a first electrode, a light emitting layer on the first electrode, and a second electrode on a side of the light emitting layer away from the first electrode. The stretchable display panel further includes a plurality of connecting lines connecting second electrodes of the plurality of light emitting elements respectively through the plurality of bridges. The plurality of
(Continued)

connecting lines include a material different from a material of the second electrode.

17 Claims, 13 Drawing Sheets

(51) Int. Cl.
*H01L 51/56* (2006.01)
*H01L 51/52* (2006.01)
(52) U.S. Cl.
CPC ...... *H01L 51/0097* (2013.01); *H01L 51/5253* (2013.01); *H01L 51/56* (2013.01); *H01L 2227/323* (2013.01)
(58) Field of Classification Search
USPC .......................................................... 257/88
See application file for complete search history.

(56) References Cited

U.S. PATENT DOCUMENTS

| | | |
|---|---|---|
| 2016/0190389 A1 | 6/2016 | Lee et al. |
| 2017/0249886 A1 | 8/2017 | Choi |
| 2018/0040678 A1 | 2/2018 | Zhai |
| 2018/0052493 A1 | 2/2018 | Hong et al. |

FOREIGN PATENT DOCUMENTS

| | | |
|---|---|---|
| CN | 108511621 A | 9/2018 |
| CN | 108550587 A | 9/2018 |

STRETCHABLE DISPLAY PANEL, STRETCHABLE DISPLAY APPARATUS, AND METHOD OF FABRICATING STRETCHABLE DISPLAY PANEL

CROSS-REFERENCE TO RELATED APPLICATION

This application is a national stage application under 35 U.S.C. § 371 of International Application No. PCT/CN2018/119331, filed Dec. 5, 2018, the contents of which are incorporated by reference in the entirety.

TECHNICAL FIELD

The present invention relates to display technology, more particularly, to a stretchable display panel, a stretchable display apparatus, and a method of fabricating a stretchable display panel.

BACKGROUND

Flexible electronic apparatuses and stretchable electronic apparatuses have been developed in recent years. Flexible electronic apparatuses are apparatuses that may be bent or folded, typically fabricated by mounting an electronic device on a flexible base substrate. Stretchable electronic apparatuses are apparatuses that allows its length to be increased in one or more dimensions. Stretchable electronic apparatuses may be useful in various applications including in display apparatuses and sensor arrays.

SUMMARY

In one aspect, the present invention provides a stretchable display panel having a plurality of encapsulated islands and a plurality of bridges connecting the plurality of encapsulated islands, comprising a plurality of light emitting elements, a respective one of the plurality of encapsulated islands comprising at least one of the plurality of light emitting elements encapsulated therein on a base substrate; wherein a respective one of the plurality of light emitting elements comprises a first electrode, a light emitting layer on the first electrode, and a second electrode on a side of the light emitting layer away from the first electrode; wherein the stretchable display panel further comprises a plurality of connecting lines connecting second electrodes of the plurality of light emitting elements respectively through the plurality of bridges; and the plurality of connecting lines comprise a material different from a material of the second electrode.

Optionally, the second electrode in the respective one of the plurality of light emitting elements is connected to a respective one of the plurality of connecting lines through a via extending through at least an insulating layer.

Optionally, the plurality of connecting lines comprises a material that is more corrosion resistant than the material of the second electrode.

Optionally, the stretchable display panel in the respective one of the plurality of encapsulated islands comprises a base substrate; a passivation layer on the base substrate; the at least one of the plurality of light emitting elements on a side of the passivation layer away from the base substrate; and an encapsulating layer encapsulating the at least one of the plurality of light emitting elements; wherein the second electrode in the respective one of the plurality of light emitting elements is connected to a respective one of the plurality of connecting lines through a via extending through at least the passivation layer.

Optionally, the stretchable display panel in the respective one of the plurality of encapsulated islands further comprises a pixel definition layer defining at least one subpixel aperture; the light emitting layer of the at least one of the plurality of light emitting elements is in the at least one subpixel aperture; and the second electrode in the respective one of the plurality of light emitting elements is connected to a respective one of the plurality of connecting lines through a via extending through the passivation layer and the pixel definition layer.

Optionally, the plurality of encapsulated islands and the plurality of bridges form a connected network; and the stretchable display panel further comprises a first barrier layer in a perimeter of the connected network.

Optionally, the stretchable display panel has a plurality of gaps respectively between adjacent encapsulated islands of the plurality of encapsulated islands; and a respective one of the plurality of gaps is surrounded by a portion of the first barrier layer.

Optionally, the first barrier layer has a first side and a second side opposing to each other, the second side being on a side of the first side away from the base substrate and having a width greater than a width of the first side.

Optionally, the stretchable display panel further comprises a second barrier layer substantially surrounding an area corresponding to one or more of the plurality of light emitting elements in a respective one of the plurality of encapsulated islands.

Optionally, the stretchable display panel further comprises a pixel definition layer defining a plurality of subpixel apertures; wherein the second barrier layer is on a side of the pixel definition layer away from the base substrate.

Optionally, the second barrier layer has a first side and a second side opposing to each other, the second side being on a side of the first side away from the base substrate and having a width greater than a width of the first side.

Optionally, adjacent encapsulated islands in a respective one row of a plurality of rows of encapsulated islands are connected together by a respective one of the plurality of connecting lines; the stretchable display panel further comprising a plurality of signal lines passing through a respective one of the plurality of bridges; and the plurality of connecting lines and the plurality of signal lines are in a same layer in the respective one of the plurality of bridges.

Optionally, the plurality of connecting lines form an inter-connected network throughout the plurality of encapsulated islands and the plurality of bridges.

Optionally, the plurality of bridges are a plurality of encapsulated bridges; and the stretchable display panel further comprising an encapsulating layer encapsulating the plurality of encapsulated islands and the plurality of encapsulated bridges.

Optionally, the stretchable display panel has a plurality of gaps respectively between adjacent encapsulated islands of the plurality of encapsulated islands.

Optionally, the plurality of gaps are arranged as a plurality of rows of gaps and a plurality of columns of gaps; a respective one of the plurality of rows of gaps is between two adjacent rows of encapsulated islands of the plurality of encapsulated islands; a respective one of the plurality of columns of gaps is between two adjacent columns of encapsulated islands of the plurality of encapsulated islands; two adjacent gaps in one row of the plurality of rows of gaps are spaced apart by a gap in a respective column of the plurality of columns of gaps; and two adjacent gaps in one column of the plurality of columns of gaps are spaced apart by a gap in a respective row of the plurality of rows of gaps.

In another aspect, the present invention provides a stretchable display apparatus, comprising the stretchable display panel described herein or fabricated by a method described herein, and one or more integrated circuits connected to the stretchable display panel.

In another aspect, the present invention provides a method of fabricating a stretchable display panel having a plurality of encapsulated islands and a plurality of bridges connecting the plurality of encapsulated islands, comprising forming a plurality of light emitting elements, a respective one of the plurality of encapsulated islands formed to comprise at least one of the plurality of light emitting elements encapsulated therein on a base substrate; wherein a respective one of the plurality of light emitting elements is formed to comprise a first electrode, a light emitting layer on the first electrode, and a second electrode on a side of the light emitting layer away from the first electrode; wherein the method further comprises forming a plurality of connecting lines connecting second electrodes of the plurality of light emitting elements respectively through the plurality of bridges; and the plurality of connecting lines are formed using a material different from a material of the second electrode.

Optionally, second electrodes of the plurality of light emitting elements are formed by depositing an electrode material in an open mask process.

Optionally, prior to depositing the electrode material in the open mask process, the method further comprises forming a barrier layer substantially surrounding one or more of the plurality of light emitting elements in a respective one of the plurality of encapsulated islands.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
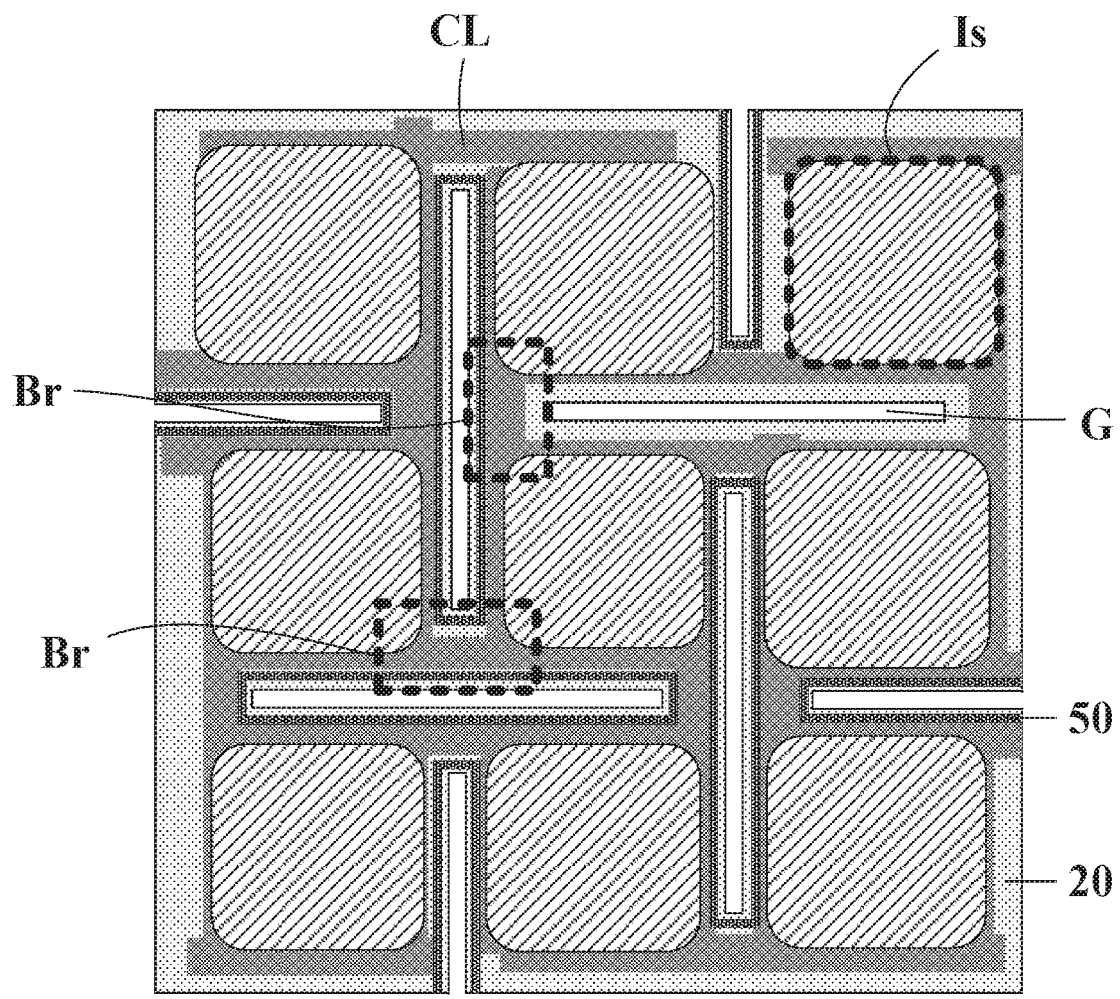
FIG. 1 is a schematic diagram illustrating the structure of a stretchable display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It is discovered in the present disclosure that, in a stretchable display panel, bridges connecting encapsulated islands are prone to damages because the bridges are subject to frequent bending and stretching. Even if the bridges are encapsulated by an encapsulating layer, the encapsulating layer is prone to break during use, thus exposing the connecting lines in the bridges.

Accordingly, the present disclosure provides, inter alia, a stretchable display panel, a stretchable display apparatus, and a method of fabricating a stretchable display panel thereof that substantially obviate one or more of the problems due to limitations and disadvantages of the related art. In one aspect, the present disclosure provides a stretchable display panel having a plurality of encapsulated islands and a plurality of bridges connecting the plurality of encapsulated islands. In some embodiments, the stretchable display panel includes a plurality of light emitting elements, a respective one of the plurality of encapsulated islands including at least one of the plurality of light emitting elements encapsulated therein on a base substrate. Optionally, a respective one of the plurality of light emitting elements includes a first electrode, a light emitting layer on the first electrode, and a second electrode on a side of the light emitting layer away from the first electrode. Optionally, the stretchable display panel further includes a plurality of connecting lines connecting second electrodes of the plurality of light emitting elements respectively through the plurality of bridges. Optionally, the plurality of connecting lines include a material different from a material of the second electrode.

As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

Figure 2:
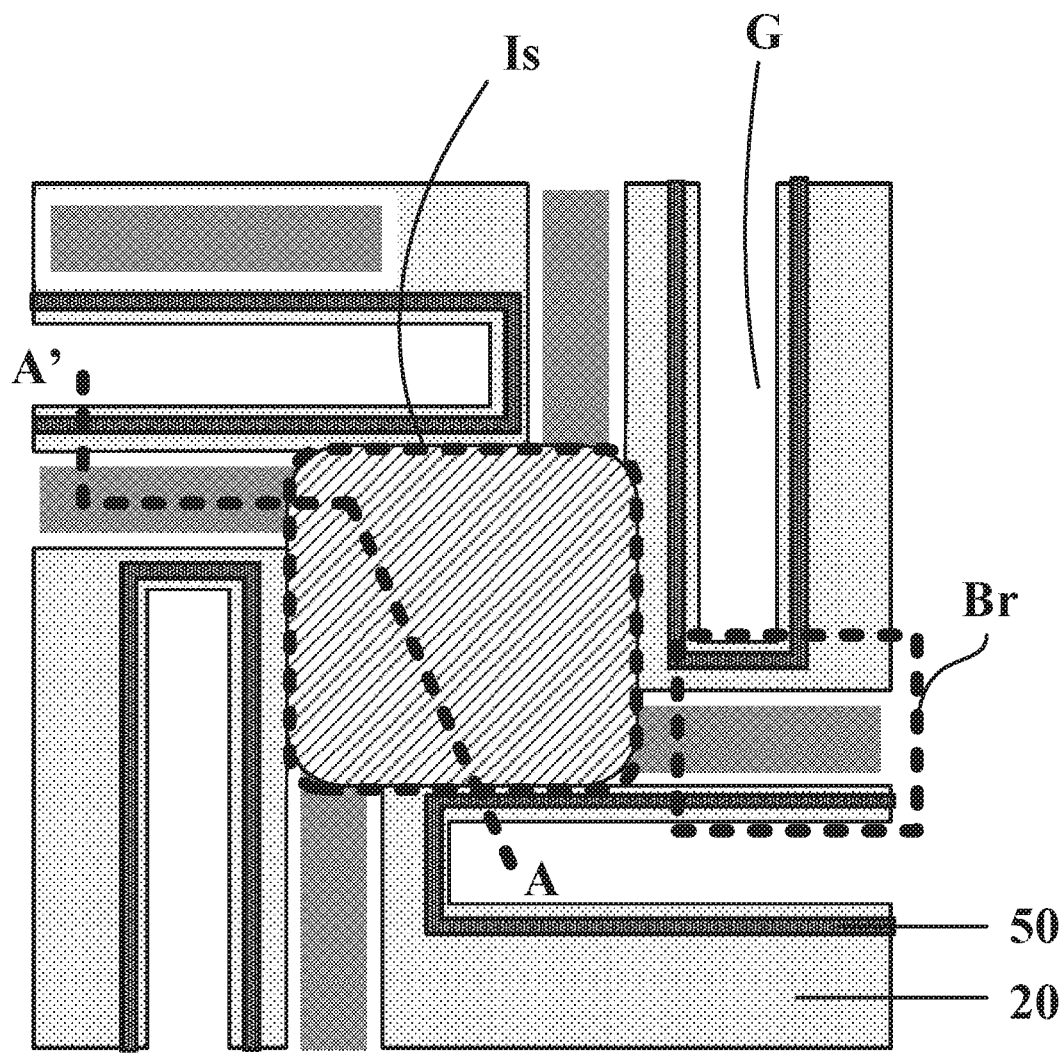
FIG. 2 is a partial view of a stretchable display panel in some embodiments according to the present disclosure.
Figure 3:
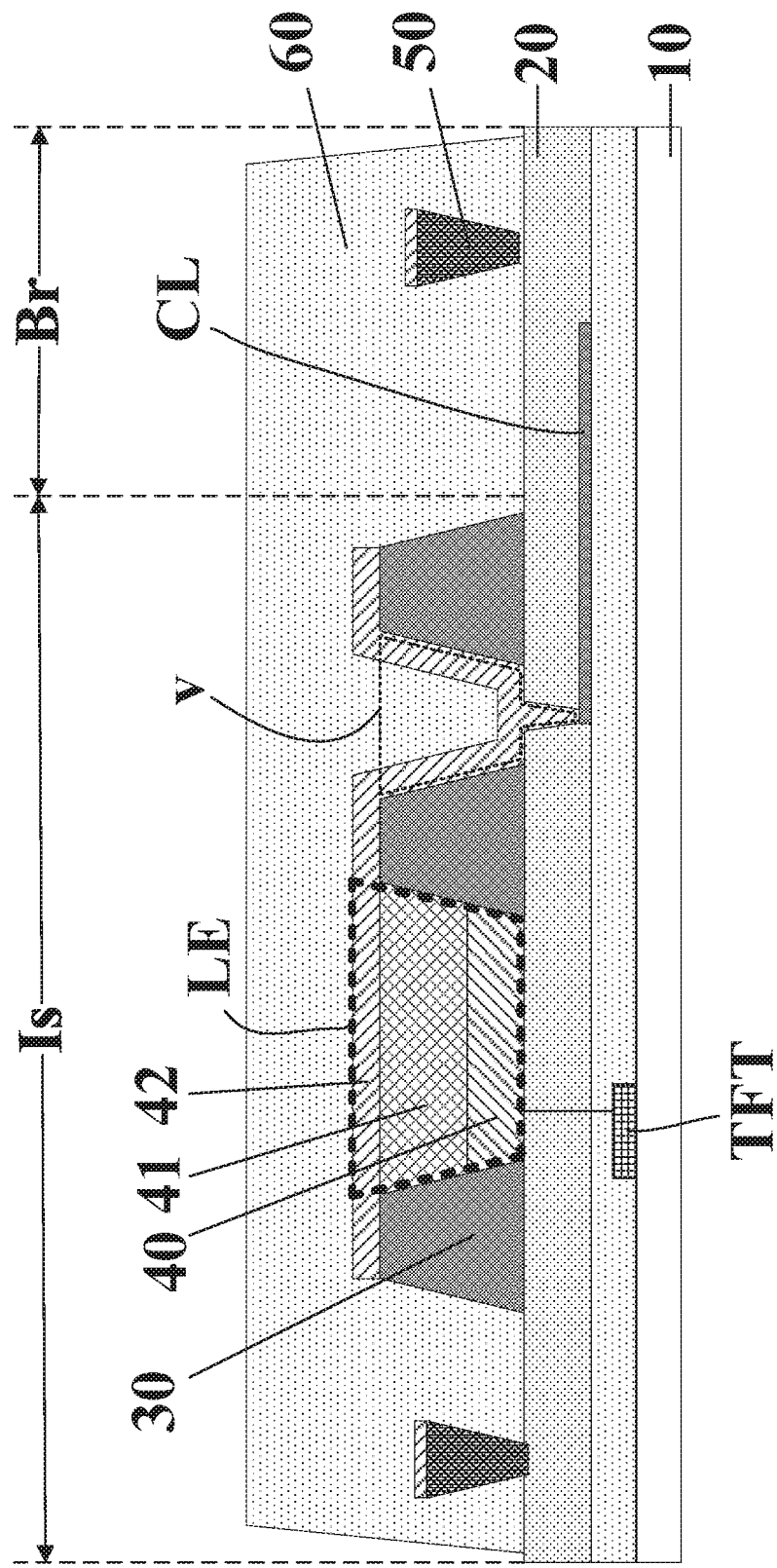
FIG. 3 is a cross-sectional view along an A-A' line in FIG. 2.

FIG. 1 is a schematic diagram illustrating the structure of a stretchable display panel in some embodiments according to the present disclosure. FIG. 2 is a partial view of a stretchable display panel in some embodiments according to the present disclosure. FIG. 3 is a cross-sectional view alone an A-A' line in FIG. 2. Referring to FIGS. 1 to 3, the stretchable display panel in some embodiments has a plurality of encapsulated islands Is and a plurality of bridges Br connecting the plurality of encapsulated islands Is. Optionally, the plurality of encapsulated islands Is and the plurality of bridges Br form an inter-connected network. Optionally, the stretchable display panel has a plurality of gaps G respectively between adjacent encapsulated islands of the plurality of encapsulated islands Is. By having the plurality of encapsulated islands Is and the plurality of bridges Br connecting the plurality of encapsulated islands Is, the present stretchable display panel can be stretched along various directions.

In some embodiments, the plurality of bridges Br are made more stretchable than the plurality of encapsulated islands Is. Optionally, the plurality of bridges Br have a Young's modulus smaller than a Young's modulus of the plurality of encapsulated islands Is. Optionally, a ratio of the Young's modulus of the plurality of encapsulated islands Is to the Young's modulus of the plurality of bridges Br is greater than 2, e.g., greater than 3, greater than 4, greater than 5, greater than 7.5, greater than 10, greater than 20, greater than 30, greater than 40, greater than 50, greater than 60, greater than 70, greater than 80, greater than 90, and greater than 100.

In some embodiments, the plurality of encapsulated islands Is as well as the plurality of bridges Br are encapsulated, e.g., the plurality of bridges Br are a plurality of encapsulated bridges. In some embodiments, the plurality of encapsulated islands Is are encapsulated whereas the plurality of bridges Br are not encapsulated, e.g., an encapsulating layer of the stretchable display panel is limited to regions corresponding to the plurality of encapsulated islands Is, and does not extend to regions corresponding to the plurality of bridges Br.

Referring to FIG. 3, in some embodiments, the stretchable display panel includes a plurality of light emitting elements LE. Each of the plurality of encapsulated islands Is includes at least one of the plurality of light emitting elements LE encapsulated therein on a base substrate 10. Optionally, each of the plurality of encapsulated islands Is includes a single one of the plurality of light emitting elements LE encapsulated therein. Optionally, each of the plurality of encapsulated islands Is includes multiple ones of the plurality of light emitting elements LE encapsulated therein. Optionally, each of the plurality of encapsulated islands Is includes a red subpixel, a blue subpixel, and a green subpixel.

Referring to FIG. 3 again, in some embodiments, each of the plurality of light emitting elements LE includes a first electrode 40, a light emitting layer 41 on the first electrode 40, and a second electrode 42 on a side of the light emitting layer 41 away from the first electrode 40. In some embodiments, the plurality of light emitting elements LE are a plurality of organic light emitting diodes, and the stretchable display panel is an organic light emitting diode display panel. In some embodiments, the plurality of light emitting elements LE are a plurality of quantum dots light emitting diodes, and the stretchable display panel is a quantum dots light emitting diode display panel. In some embodiments, the plurality of light emitting elements LE are a plurality of micro light emitting diodes, and the stretchable display panel is a micro light emitting diode display panel. The stretchable display panel further includes a plurality of thin film transistors TFT for driving light emission of the plurality of light emitting elements LE. Optionally, the first electrode 40 is connected to a drain electrode of a respective one of the plurality of thin film transistors TFT.

Referring to FIGS. 1 to 3, the stretchable display panel in some embodiments further includes a plurality of connecting lines CL connecting second electrodes of the plurality of light emitting elements LE respectively through the plurality of bridges Br. In the present disclosure, the plurality of connecting lines CL includes a material different from a material of the second electrode 42. In particular, the plurality of connecting lines CL may include a material that is more corrosion resistant than the material of the second electrode 42.

It is discovered in the present disclosure that, in a stretchable display panel, bridges connecting encapsulated islands are prone to damages because the bridges are subject to frequent bending and stretching. Even if the bridges are encapsulated by an encapsulating layer, the encapsulating layer is prone to break during use, thus exposing the connecting lines in the bridges. By having the plurality of connecting lines CL made of a corrosion resistant material (such as aluminum), the plurality of connecting lines CL can function normally even when the plurality of bridges Br are not encapsulated or the encapsulating layer in the plurality of bridges Br is damaged. Accordingly, the stretchable display panel can be made more resistant to oxygen and moist in the environment, enhancing the life time of the stretchable display panel. For example, the second electrode 42 in some embodiments is made of silver, which is prone to corrosion by oxygen or moist. When the plurality of connecting lines CL are formed in a same patterning process as the second electrode 42 using a same material, the plurality of connecting lines CL are made of silver as well. When the encapsulating layer encapsulating the plurality of bridges Br is broken, the plurality of connecting lines CL in the plurality of bridges Br are exposed to the external environment, and can be easily damaged.

Further, in some embodiments, the second electrode 42 in each of the plurality of light emitting elements LE is connected to a respective one of the plurality of connecting lines CL through a via extending through at least an insulating layer. Referring to FIG. 3, the second electrode 42 in each of the plurality of light emitting elements LE is connected to a respective one of the plurality of connecting lines CL through a via v extending through a pixel definition layer 30 and a passivation layer 20.

Figure 4:
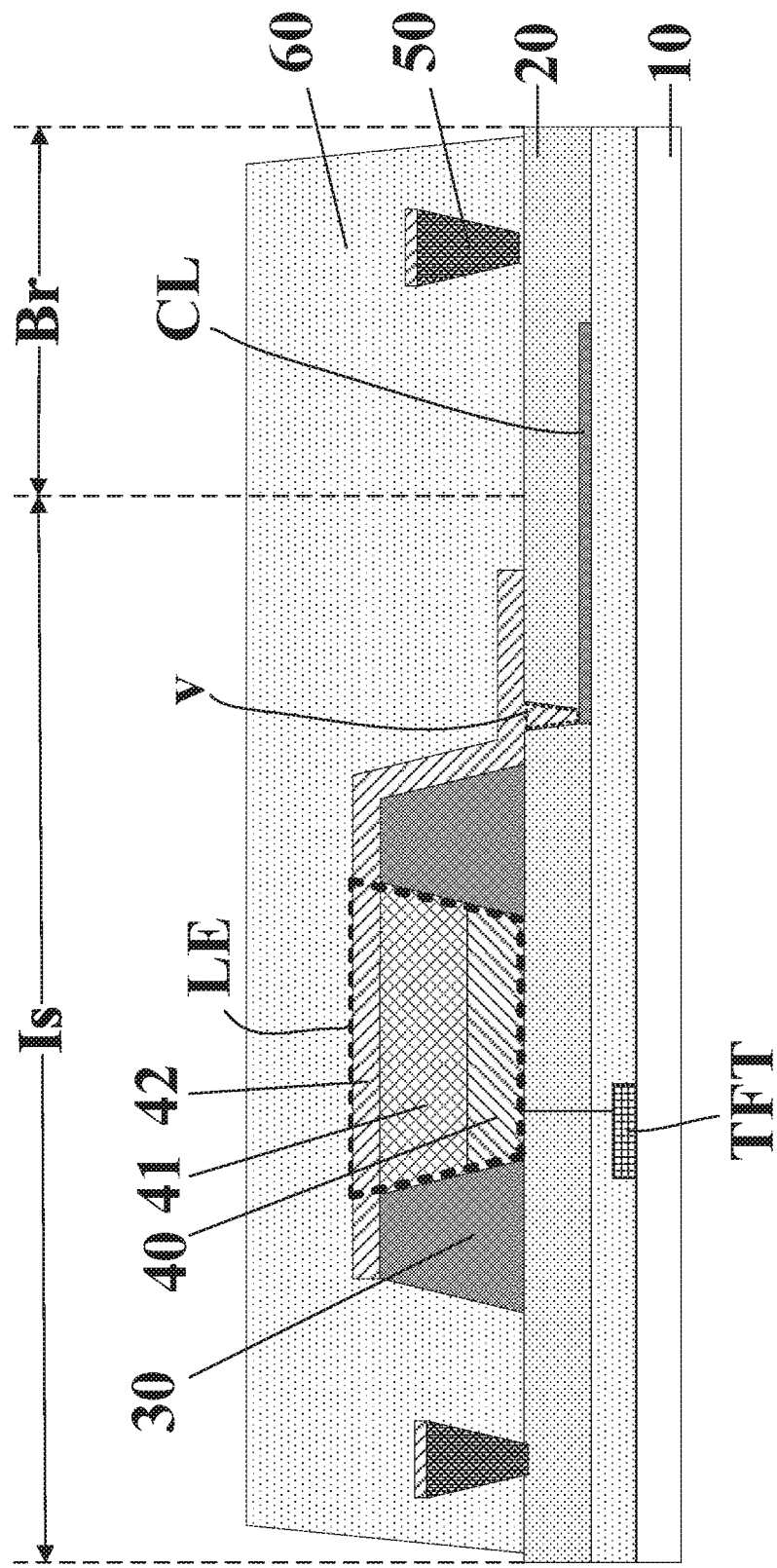
FIG. 4 is a cross-sectional view of a stretchable display p some embodiments according to the present disclosure.

FIG. 4 is a cross-sectional view of a stretchable display panel in some embodiments according to the present disclosure. Referring to FIG. 4, in some embodiments, the second electrode 42 in each of the plurality of light emitting elements LE is connected to a respective one of the plurality of connecting lines CL through a via v extending through the passivation layer 20.

Referring to FIG. 3 and FIG. 4, in some embodiments, the stretchable display panel in each of the plurality of encapsulated islands Is includes a base substrate 10; a passivation layer 20 on the base substrate 10; at least one of the plurality of light emitting elements LE on a side of the passivation layer 20 away from the base substrate 10; and an encapsulating layer 60 encapsulating the at least one of the plurality of light emitting elements LE. In some embodiments, the stretchable display panel in each of the plurality of encapsulated islands Is further includes a pixel definition layer 30 defining at least one subpixel aperture. The light emitting layer 41 of the at least one of the plurality of light emitting elements LE is in the at least one subpixel aperture. In FIG. 3, the second electrode 42 in each of the plurality of light emitting elements LIE is connected to a respective one of the plurality of connecting lines CL through a via v extending through the passivation layer 20 and the pixel definition layer 30. In FIG. 4, the second electrode 42 in each of the plurality of light emitting elements LE is connected to a respective one of the plurality of connecting lines CL through a via v extending through the passivation layer 20.

Referring to FIGS. 1 to 4, in some embodiments, the stretchable display panel further includes a first barrier layer 50. As shown in FIG. 1, the plurality of encapsulated islands Is and the plurality of bridges Br form a connected network, the first barrier layer 50 is in a perimeter of the connected network. For example, the plurality of encapsulated islands Is and the plurality of bridges Br in combination (e.g., the stretchable display panel) forms a combined shape, the first barrier layer 50 is in a perimeter of the combined shape.

Referring to FIG. 1, in some embodiments, the stretchable display panel has a plurality of gaps G respectively between adjacent encapsulated islands of the plurality of encapsulated islands Is. Optionally, each of the plurality of gaps G is surrounded by a portion of the first barrier layer 50.

Figure 5:
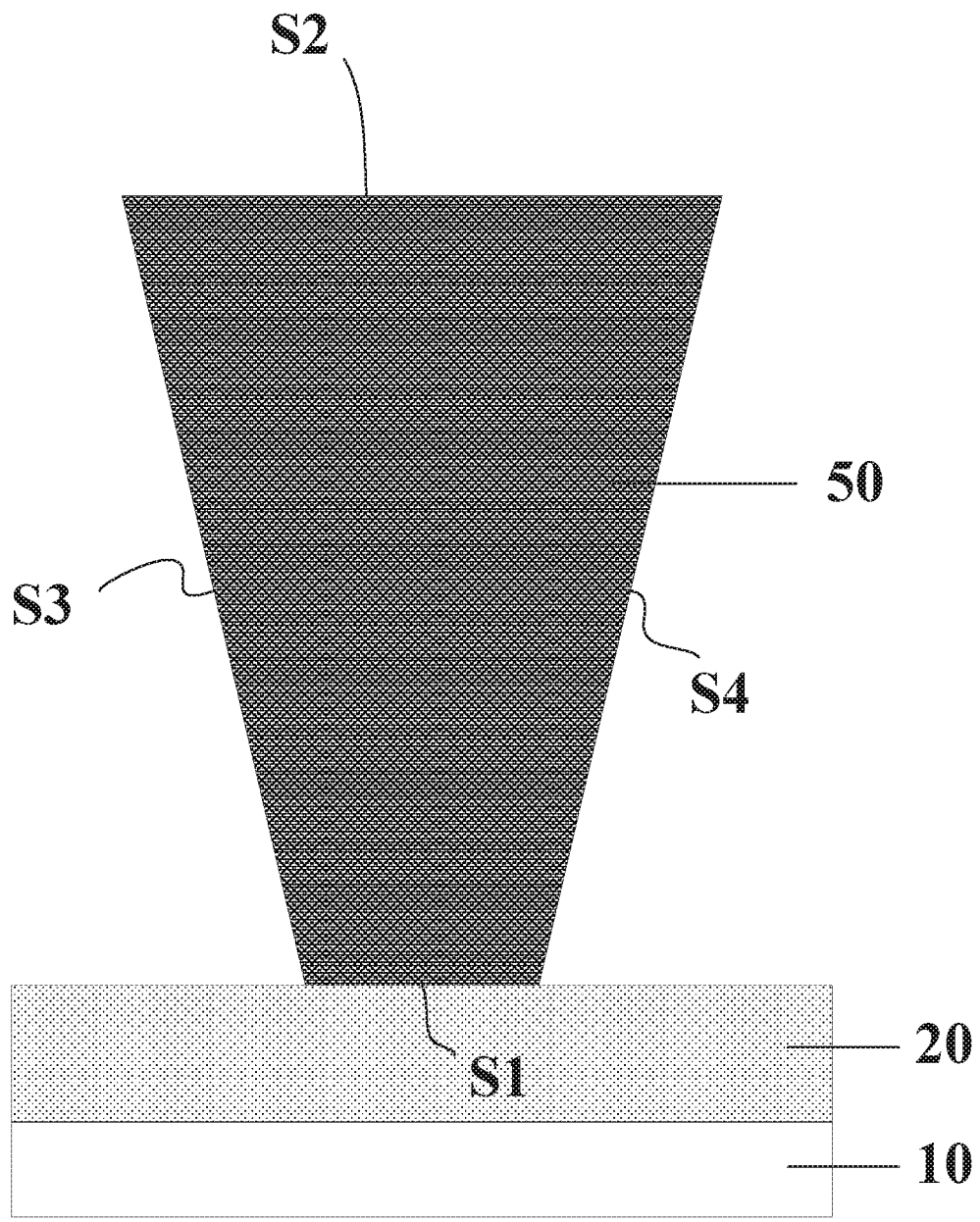
FIG. 5 is a schematic diagram illustrating the structure of a first barrier layer in some embodiments according to the present disclosure.

FIG. 5 is a schematic diagram illustrating the structure of a first barrier layer in some embodiments according to the present disclosure. Referring to FIG. 5, in some embodiments, the first barrier layer 50 has a first side S1 and a second side S2 opposing to each other. The second side S2 is on a side of the first side S1 away from the base substrate 10 and having a width greater than a width of the first side S1. Optionally, the first barrier layer 50 further has a third side S3 and a fourth side S4 facing each other. Each of the third side S3 and the fourth side S4 connects the first side S1 to the second side S2. Optionally, a cross-section of the first barrier layer 50 along a plane perpendicular to the base substrate 10 and parallel to a width direction of the first barrier layer 50 has a substantially inverted trapezoidal shape, a longer base of the inverted trapezoidal shape is on a side of a shorter base of the inverted trapezoidal shape away from the base substrate 10.

Figure 6:
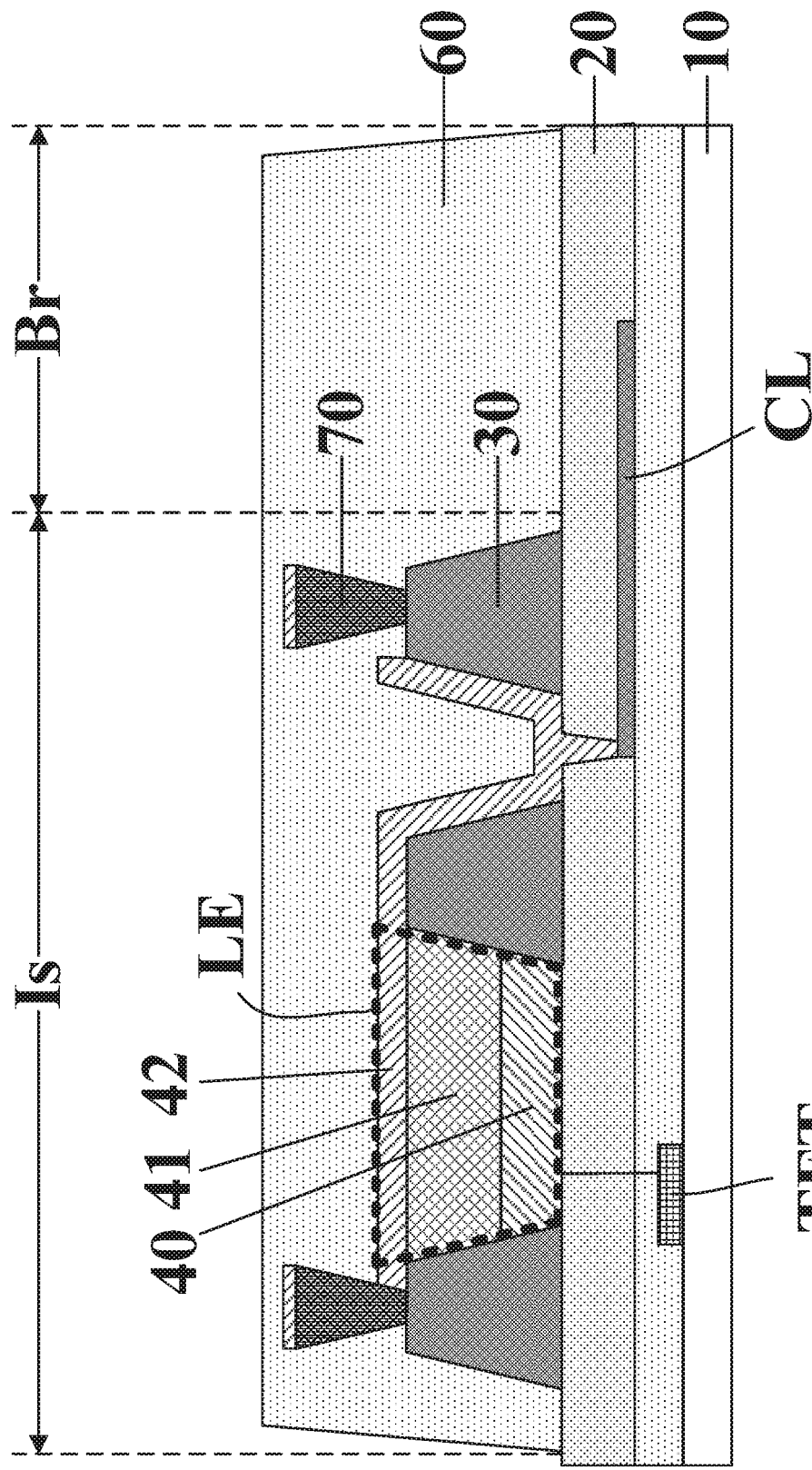
FIG. 6 is a cross-sectional view of a stretchable display panel in some embodiments according to the present disclosure.

FIG. 6 is a cross-sectional view of a stretchable display panel in some embodiments according to the present disclosure. Referring to FIG. 6, in some embodiments, the stretchable display panel further includes a second barrier layer 70 substantially surrounding an area corresponding to one or more of the plurality of light emitting elements LE in a respective one of the plurality of encapsulated islands Is. As used herein the term "substantially surrounding" refers to surrounding at least 50% (e.g., at least 60%, at least 70%, at least 80%, at least 90%, at least 95%, at least 99%, and 100%) of a perimeter of an area.

Figure 7:
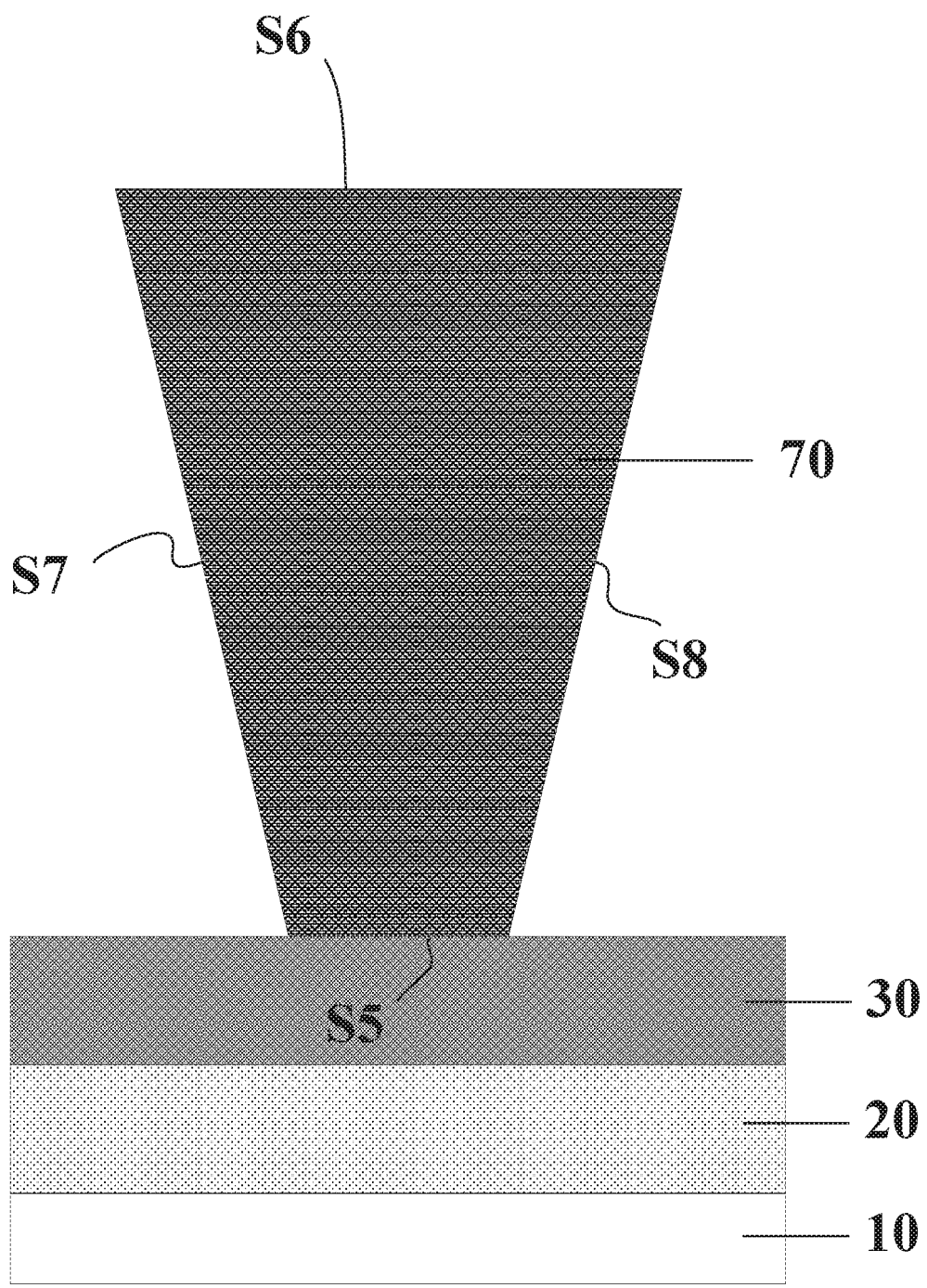
FIG. 7 is a schematic diagram illustrating the structure of a second barrier layer in some embodiments according to the present disclosure.

FIG. 7 is a schematic diagram illustrating the structure of a second barrier layer in some embodiments according to the present disclosure. Referring to FIG. 7, in some embodiments, the second barrier layer 70 has a fifth side S5 and a sixth side S6 opposing to each other. The sixth side S6 is on a side of the fifth side S5 away from the base substrate 10 and having a width greater than a width of the fifth side S5. Optionally, the second barrier layer 70 further has a seventh side S7 and an eighth side S8 facing each other. Each of the seventh side S7 and the eighth side S8 connects the fifth side S5 to the sixth side S6. Optionally, a cross-section of the second barrier layer 70 along a plane perpendicular to the base substrate 10 and parallel to a width direction of the second barrier layer 70 has a substantially inverted trapezoidal shape, a longer base of the inverted trapezoidal shape is on a side of a shorter base of the inverted trapezoidal shape away from the base substrate 10.

Referring to FIG. 6, in some embodiments, the second barrier layer 70 is on a side of the pixel definition layer 30 away from the base substrate 10. By having a second barrier layer 70, the second electrode 42 can be formed by depositing an electrode material to the base substrate 10 in an open mask process. Due to the shape of the second barrier layer 70, the second electrode 42 formed in the open mask process is separated from electrode material deposited outside the subpixel aperture defined by the pixel definition layer 30 (defined by the second barrier layer 70 as well).

Figure 8:
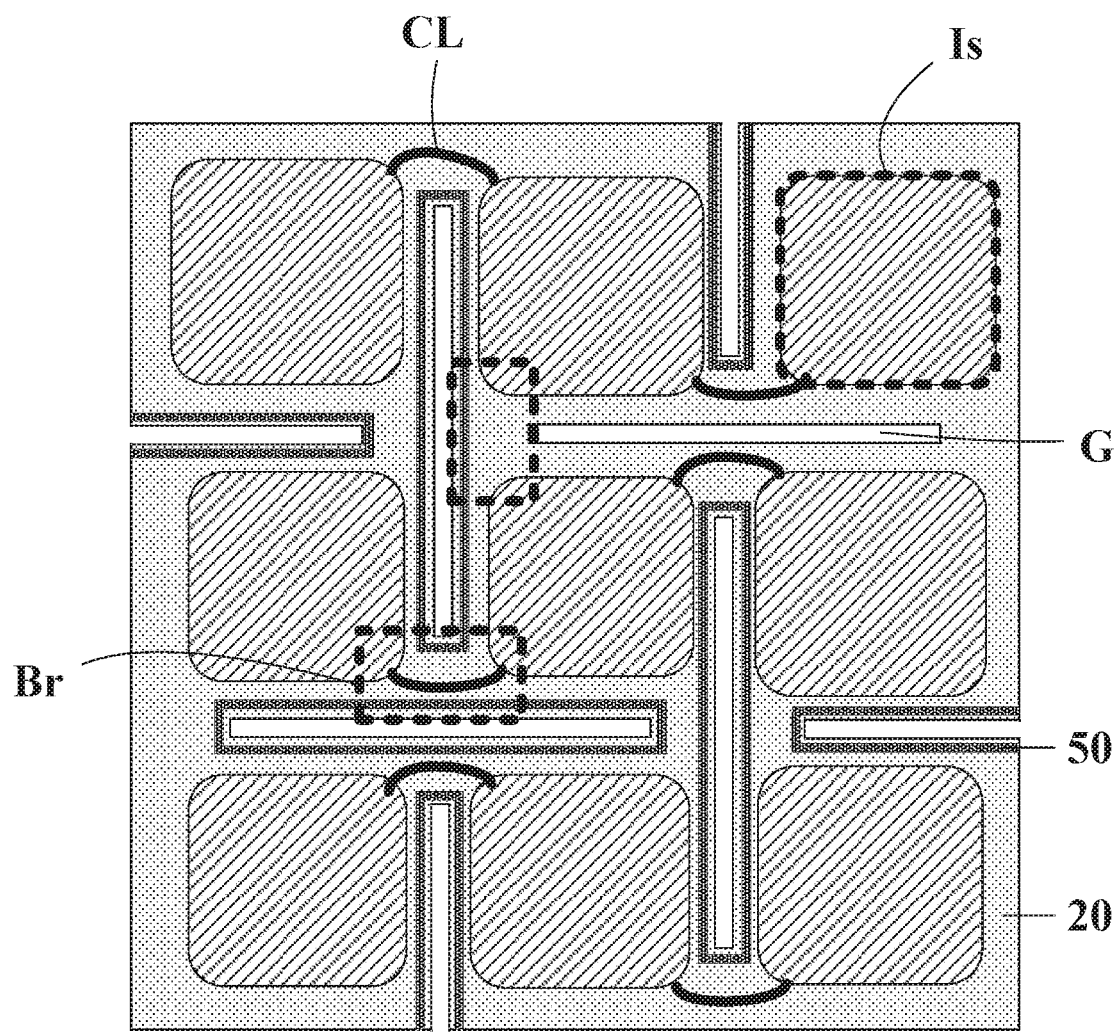
FIG. 8 is a schematic diagram illustrating the structure of a stretchable display panel in some embodiments according to the present disclosure.

FIG. 8 is a schematic diagram illustrating the structure of a stretchable display panel in some embodiments according to the present disclosure. Referring to FIG. 8, the plurality of encapsulated islands Is are arranged as a plurality of rows of encapsulated islands. Optionally, adjacent encapsulated islands in each individual row of a plurality of rows of encapsulated islands are connected together by a respective one of the plurality of connecting lines CL. Optionally, the adjacent encapsulated islands in two different rows of the plurality of rows of encapsulated islands are not connected, e.g., not connected by any of the plurality of connecting lines CL. In particular, when the plurality of connecting lines CL and other signal lines of the stretchable display panel are disposed in a same layer in the plurality of bridges Br, this arrangement is particularly suitable.

Figure 9:
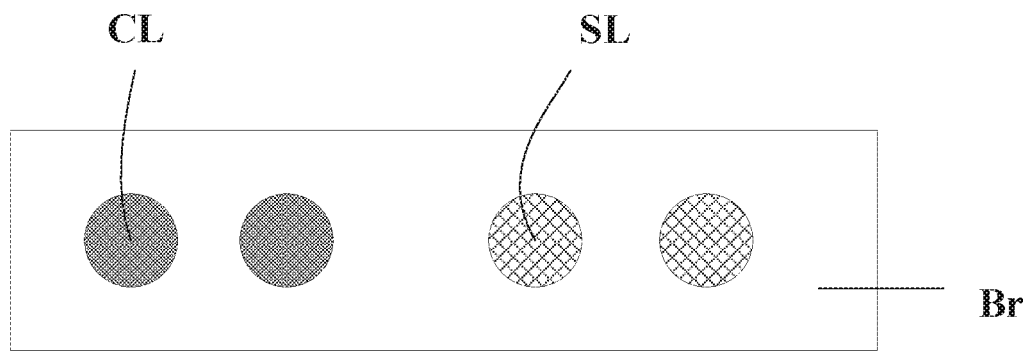
FIG. 9 is a cross-sectional view of a bridge of a stretchable display panel illustrating an arrangement of signal lines and connecting lines in some embodiments according to the present disclosure.
Figure 10:
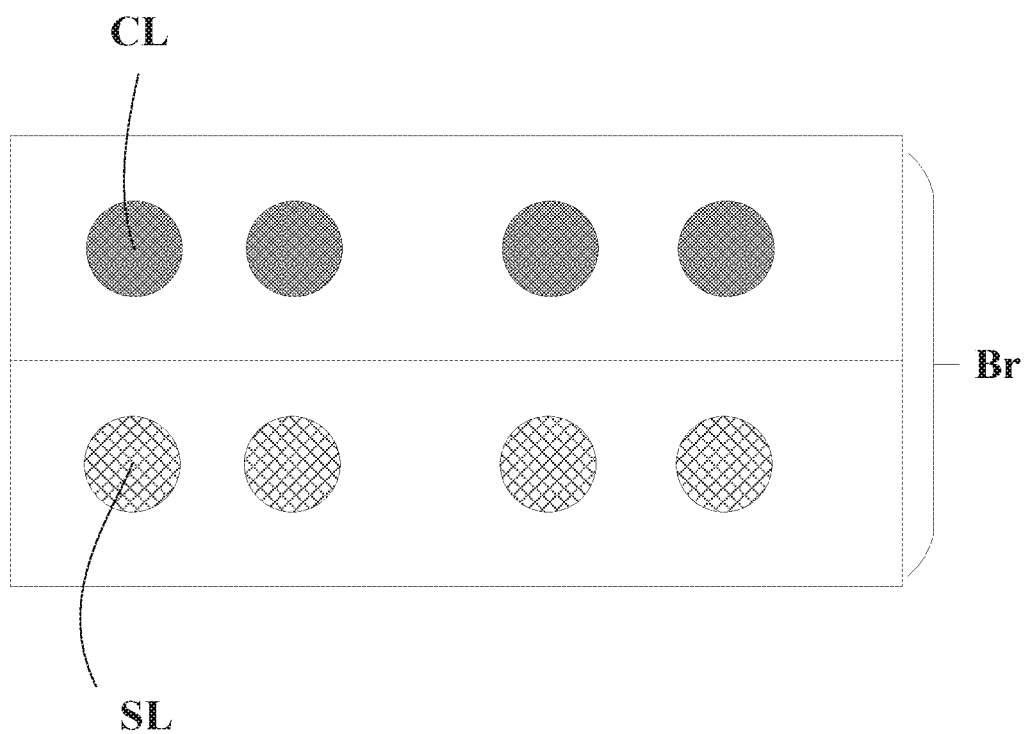
FIG. 10 is a cross-sectional view of a bridge of a stretchable display panel illustrating an arrangement of signal lines and connecting lines in some embodiments according to the present disclosure.

FIG. 9 is a cross-sectional view of a bridge of a stretchable display panel illustrating an arrangement of signal lines and connecting lines in some embodiments according to the present disclosure. Referring to FIG. 9, the plurality of connecting lines CL and a plurality of signal lines SL in one of the plurality of bridges Br are in a same layer. FIG. 10 is a cross-sectional view of a bridge of a stretchable display panel illustrating an arrangement of signal lines and connecting lines in some embodiments according to the present disclosure. Referring to FIG. 10, the plurality of connecting lines CL is in a layer different from that of a plurality of signal lines SL in one of the plurality of bridges Br. Optionally, the plurality of signal lines SL includes a plurality of gate lines. Optionally, the plurality of signal lines SL includes a plurality of data lines. Optionally, the plurality of signal lines SL includes a plurality of gate lines and a plurality of data lines.

Figure 11:
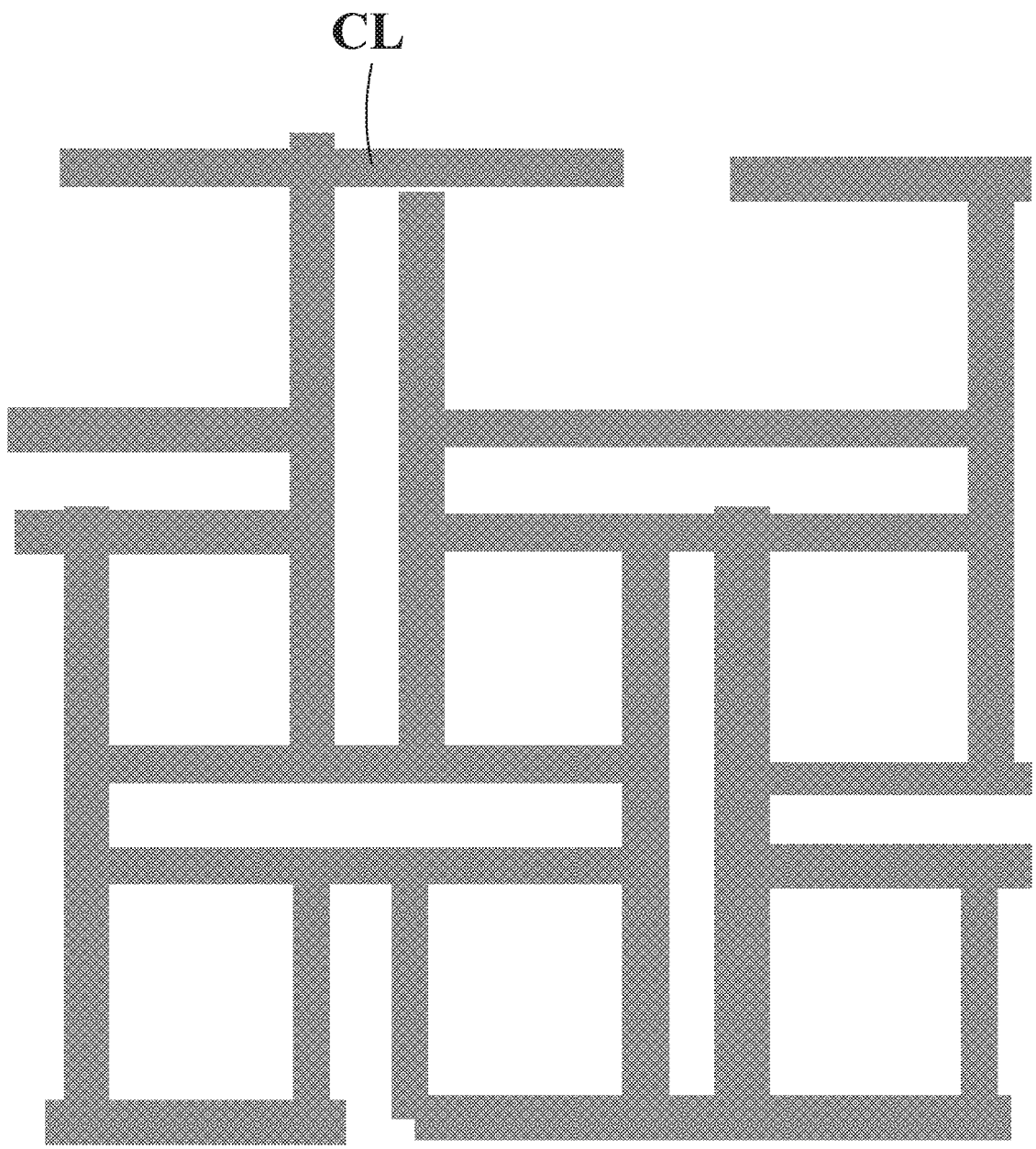
FIG. 11 is a schematic diagram illustrating an interconnected network formed by a plurality of connecting lines in some embodiments according to the present disclosure.

FIG. 11 is a schematic diagram illustrating an interconnected network formed by a plurality of connecting lines in some embodiments according to the present disclosure. Referring to FIG. 11 and FIG. 1, in some embodiments, the plurality of connecting lines CL form an inter-connected network throughout the plurality of encapsulated islands Is and the plurality of bridges Br. In particular, when the plurality of connecting lines CL and other signal lines of the stretchable display panel are disposed in different layers in the plurality of bridges Br, this arrangement is particularly suitable.

Referring to FIG. 1 again, in some embodiments, the stretchable display panel has a plurality of gaps G respectively between adjacent encapsulated islands of the plurality of encapsulated islands Is. Optionally, as shown in FIG. 1, the plurality of gaps G are arranged as a plurality of rows of gaps and a plurality of columns of gaps. Optionally, each of the plurality of rows of gaps is between two adjacent rows of encapsulated islands of the plurality of encapsulated islands, and each of the plurality of columns of gaps is between two adjacent columns of encapsulated islands of the plurality of encapsulated islands. Optionally, two adjacent gaps in one row of the plurality of rows of gaps are spaced apart by a gap in a respective column of the plurality of columns of gaps; and two adjacent gaps in one column of the plurality of columns of gaps are spaced apart by a gap in a respective row of the plurality of rows of gaps.

Optionally, each of the plurality of encapsulated islands Is has a width in a range of approximately 100 µm to approximately 1000 µm, e.g., approximately 100 µm to approximately 200 µm, approximately 200 µm to approximately 300 µm, approximately 300 82 m to approximately 400 µm, approximately 400 µm to approximately 500 µm, approximately 500 µm to approximately 600 µm, approximately 600 µm to approximately 700 µm, approximately 700 µm to approximately 800 µm, approximately 800 µm to approximately 900 µm, and approximately 900 µm to approximately 1000 µm.

Optionally, adjacent encapsulated islands of the plurality of encapsulated islands Is are spaced apart by a distance less than 100 µm, e.g., in a range of approximately 10 µm to approximately 100 µm.

In another aspect, the present disclosure provides a stretchable display apparatus including a stretchable display panel described herein or fabricated by a method described herein. Examples of appropriate display apparatuses include, but are not limited to, an electronic paper, a mobile phone, a tablet computer, a television, a monitor, a notebook computer, a digital album, a GPS, etc. Optionally, the stretchable display apparatus further includes one or more integrated circuits connected to the stretchable display panel.

In some embodiments, the plurality of light emitting elements are a plurality of organic light emitting diodes, and the stretchable display apparatus is an organic light emitting diode display apparatus. In some embodiments, the plurality of light emitting elements are a plurality of quantum dots light emitting diodes, and the stretchable display apparatus is a quantum dots light emitting diode display apparatus. In some embodiments, the plurality of light emitting elements are a plurality of micro light emitting diodes, and the stretchable display apparatus is a micro light emitting diode display apparatus.

In another aspect, the present disclosure provides a method of fabricating a stretchable display panel having a plurality of encapsulated islands and a plurality of bridges connecting the plurality of encapsulated islands. In some embodiments, the method includes forming a plurality of light emitting elements. Optionally, a respective one of the plurality of encapsulated islands is formed to include at least one of the plurality of light emitting elements encapsulated therein on a base substrate. Optionally, forming a respective one of the plurality of light emitting elements includes forming a first electrode, forming a light emitting layer on the first electrode, and forming a second electrode on a side of the light emitting layer away from the first electrode.

In some embodiments, the method further includes forming a plurality of connecting lines connecting second electrodes of the plurality of light emitting elements respectively through the plurality of bridges. The plurality of connecting lines are formed using a material different from a material of the second electrode.

In some embodiments, the second electrodes of the plurality of light emitting elements are formed in a patterning process, e.g., a lithographic process. In one example, an electrode material is deposited on the base substrate, and is patterned using a mask plate to form a plurality of electrode blocks separated from each other. Optionally, each of the plurality of electrodes blocks is limited to one of the plurality of encapsulated islands, and is encapsulated by an encapsulating layer in the one of the plurality of encapsulated islands. Optionally, each of the plurality of electrode blocks constitutes the second electrode for a single one of the plurality of light emitting elements. Optionally, each of the plurality of electrode blocks constitutes the second electrode for multiple ones of the plurality of light emitting elements encapsulated in a single one of the plurality of encapsulated islands.

In some embodiments, the second electrodes of the plurality of light emitting elements are formed in an open mask process. In one example, an electrode material is deposited on the base substrate in the open mask process. Optionally, prior to depositing he electrode material in the open mask process, the method further includes forming a barrier layer substantially surrounding one or more of the plurality of light emitting elements in a respective one of the plurality of encapsulated islands.

In some embodiments, prior to depositing the electrode material for forming the second electrode, the method further includes forming a via extending through at least an insulating layer on the base substrate. The second electrode in each of the plurality of light emitting elements is formed to be connected to a respective one of the plurality of connecting lines through a via extending through at least an insulating layer. Optionally, the electrode material for forming the second electrode is different from the material for forming the plurality of connecting lines. Optionally, the plurality of connecting lines are formed using a material that is more corrosion resistant than the material of the second electrode.

Various appropriate conductive materials may be used for making the plurality of connecting lines. Examples of appropriate conductive materials for making the plurality of connecting lines include metals, alloys, graphene, carbon nanotubes, flexible conductive polymers, and other flexible conductive materials.

Various appropriate conductive materials may be used for making the second electrode. Examples of appropriate conductive materials for making the second electrode include various transparent conductive material such as a metallic material including silver, and transparent metal oxides such as indium tin oxide.

In some embodiments, the base substrate is a flexible base substrate. Various appropriate flexible materials may be used for making the base substrate. Examples of appropriate flexible materials for making the base substrate include polyimide, polycarbonate, polyethersulfone, polyethylene terephthalate, polyethylene naphthalate, polyarylate, and fiber-reinforced plastic. Optionally, the base substrate is a transparent base substrate. Optionally, the base substrate is a non-transparent base substrate.

In some embodiments, forming each of the plurality of encapsulated islands includes forming a passivation layer on the base substrate; forming the at least one of the plurality of light emitting elements on a side of the passivation layer away from the base substrate; and forming an encapsulating layer encapsulating the at least one of the plurality of light emitting elements. In some embodiments, forming the encapsulating layer includes forming multiple sublayers, including forming one or more inorganic encapsulating sublayers and forming one or more organic encapsulating sublayers for enhanced encapsulation ability to prevent oxygen or moist from entering the display substrate. In one example, forming the encapsulating layer includes forming a first organic encapsulating sublayer, forming a first inorganic encapsulating sublayer on the first organic encapsulating sublayer, forming a second organic encapsulating sublayer on a side of the first inorganic encapsulating sublayer away from the first organic encapsulating sublayer, and forming a second inorganic encapsulating sublayer on a side of the second organic encapsulating sublayer away from the first inorganic encapsulating sublayer.

Optionally, the step of forming the via includes forming a via extending through at least the passivation layer; and the second electrode in each of the plurality of light emitting elements is formed to be connected to the respective one of the plurality of connecting lines through the via extending through at least the passivation layer.

In some embodiments, forming each of the plurality of encapsulated islands further includes forming a pixel definition layer defining at least one subpixel aperture. The light emitting layer of the at least one of the plurality of light emitting elements is formed in the at least one subpixel aperture. The second electrode in each of the plurality of light emitting elements is formed to be connected to a respective one of the plurality of connecting lines through a via extending through the passivation layer and the pixel definition layer.

In some embodiments, the method further includes forming a first barrier layer on the base substrate. Optionally, the plurality of encapsulated islands and the plurality of bridges form a connected network, the first barrier layer is formed in a perimeter of the connected network.

In some embodiments, the method further includes forming a plurality of gaps respectively between adjacent encapsulated islands of the plurality of encapsulated islands. Optionally, each of the plurality of gaps extends through the base substrate. Optionally, each of the plurality of gaps extends through one or more structural layers on the base substrate, but at least a portion of the base substrate remains. Optionally, the first barrier layer is formed so that each of the plurality of gaps is surrounded by a portion of the first barrier layer.

In some embodiments, the first barrier layer is formed to have a first side and a second side opposing to each other, the second side being formed on a side of the first side away from the base substrate and having a width greater than a width of the first side. Optionally, the first barrier layer is formed so that a cross-section of the first barrier layer along a plane perpendicular to the base substrate and parallel to a width direction of the first barrier layer has a substantially inverted trapezoidal shape, a longer base of the inverted trapezoidal shape being on a side of a shorter base of the inverted trapezoidal shape away from the base substrate.

In some embodiments, the method further includes forming a second barrier layer. Optionally, the second barrier layer is formed substantially surrounding an area corresponding to one or more of the plurality of light emitting elements in a respective one of the plurality of encapsulated islands. Optionally, the second barrier layer is formed on a side of the pixel definition layer away from the base substrate. Optionally, the second barrier layer is formed to have a first side and a second side opposing to each other, the second side being on a side of the first side away from the base substrate and having a width greater than a width of the first side. Optionally, the second barrier layer is formed so that a cross-section of the second barrier layer along a plane perpendicular to the base substrate and parallel to a width direction of the second barrier layer has a substantially inverted trapezoidal shape, a longer base of the inverted trapezoidal shape being on a side of a shorter base of the inverted trapezoidal shape away from the base substrate.

In some embodiments, the method further includes forming a plurality of signal lines passing through each of the plurality of bridges. Optionally, the plurality of connecting lines and the plurality of signal lines are formed in a same layer in each of the plurality of bridges. Optionally, the plurality of connecting lines and the plurality of signal lines are formed in different layers in each of the plurality of bridges.

Various appropriate insulating materials and various appropriate fabricating methods may be used for making the first barrier layer and the second barrier layer. For example, an insulating material may be deposited on the substrate by a plasma-enhanced chemical vapor deposition (PECVD) process and patterned. Examples of appropriate insulating materials for making the first barrier layer and the second barrier layer include, but are not limited to, silicon oxide ($SiO_x$), silicon nitride ($SiN_y$, e.g., $Si_3N_4$), silicon oxynitride ($SiO_xN_y$). Optionally, the first barrier layer and the second barrier layer are made of an inorganic material.

Figure 12A:
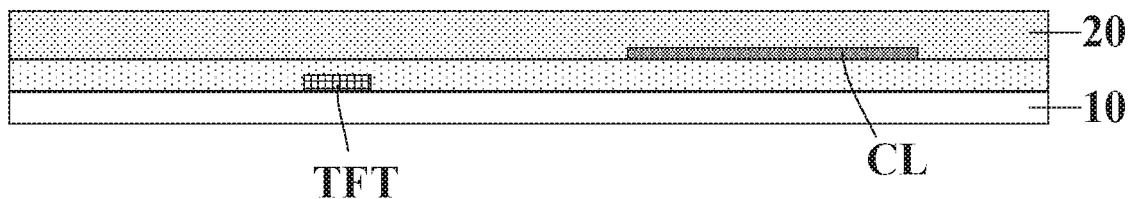
FIGS. 12A to 12F illustrates a method of fabricating a stretchable display panel in some embodiments according to the present disclosure.
Figure 12B:
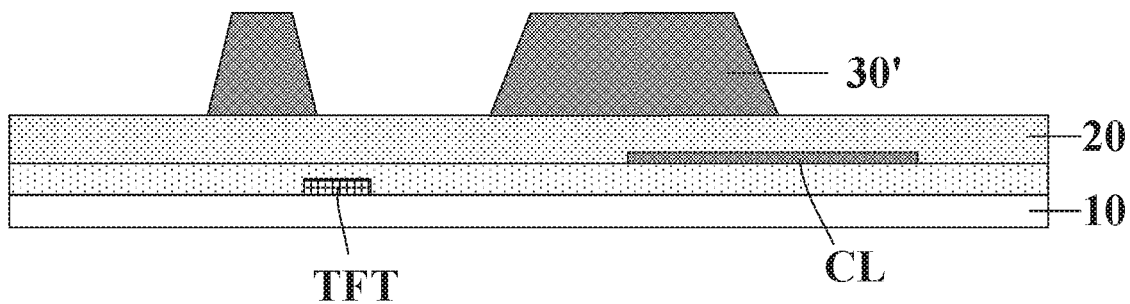
Figure 12C:
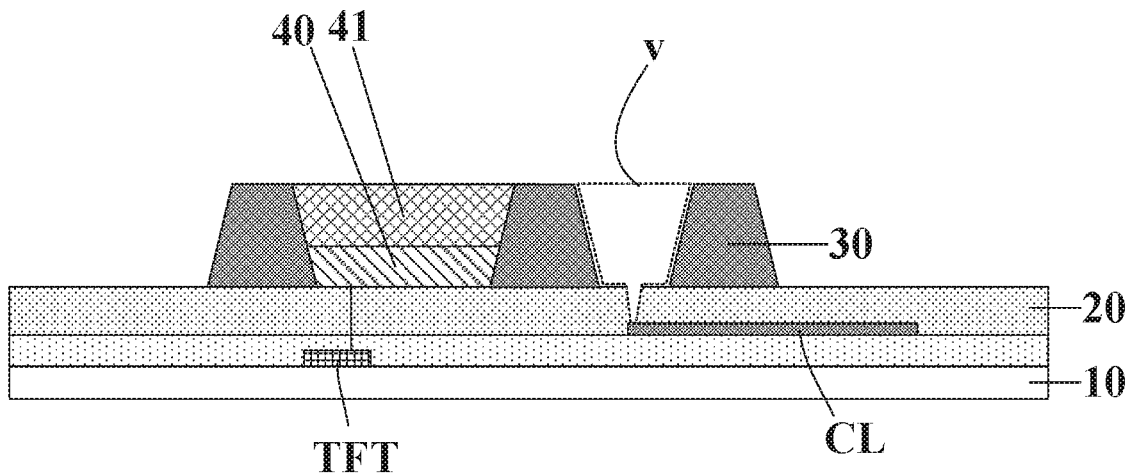

FIGS. 12A to 12F illustrates a method of fabricating a stretchable display panel in some embodiments according to the present disclosure. Referring to FIG. 12A, a plurality of connecting lines CL are formed on a base substrate 10, and a passivation layer 20 is formed on a side of the plurality of connecting lines CL away from the base substrate 10. Referring to FIG. 12B, a pixel definition material layer 30' is formed on a side of the passivation layer 20 away from the base substrate 10. The pixel definition material layer 30' is formed to define a plurality of subpixel apertures. Referring to FIG. 12C, a first electrode 40 is formed on a side of the passivation layer 20 away from the base substrate 10, and a light emitting layer 41 is formed on a side of the first electrode 40 away from the base substrate 10. The light emitting layer 41 is formed in one of the subpixel apertures defined by the pixel definition material layer. A via v is formed to extend through the pixel definition material layer and the passivation layer 20, thereby forming a pixel definition layer 30 as shown in FIG. 12C.

Figure 12D:
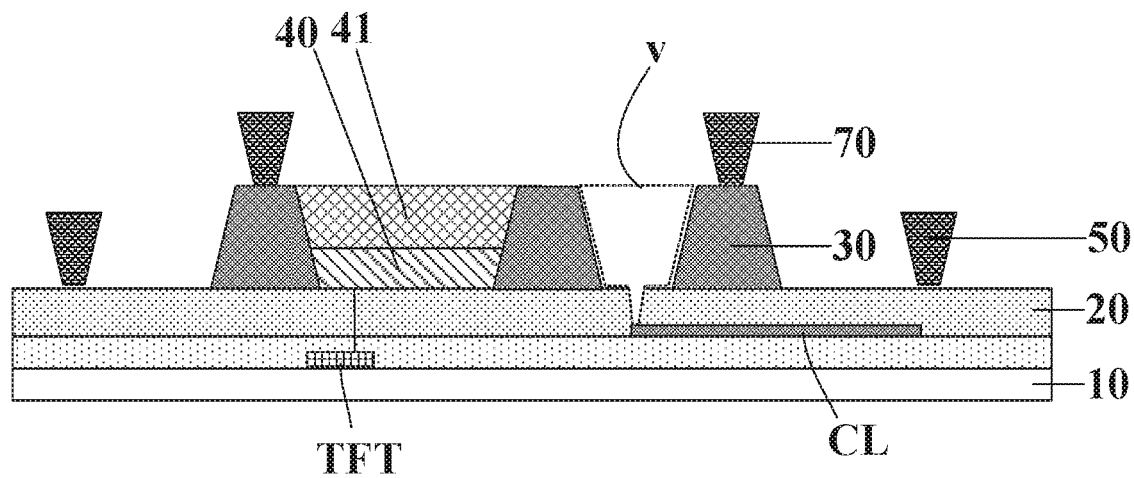

Referring to FIG. 12D, a first barrier layer 50 is formed in a perimeter of the connected network of the plurality of encapsulated islands and the plurality of bridges, as discussed above, and a second barrier layer 70 is formed on a side of the pixel definition layer 30 away from the base substrate 10. The first barrier layer 50 and the second barrier layer 70 are formed in a single patterning process using a single mask plate and a same material. As used herein, the term "same layer" refers to the relationship between the layers simultaneously formed in the same step. In one example, the first barrier layer 50 and the second barrier layer 70 are in a same layer when they are formed as a result of one or more steps of a same patterning process performed in a same layer of material. In another example, the first barrier layer 50 and the second barrier layer 70 can be formed in a same layer by simultaneously performing the step of forming the first barrier layer 50 and the step of forming the second barrier layer 70. The term "same layer" does not always mean that the thickness of the layer or the height of the layer in a cross-sectional view is the same.

Figure 12E:
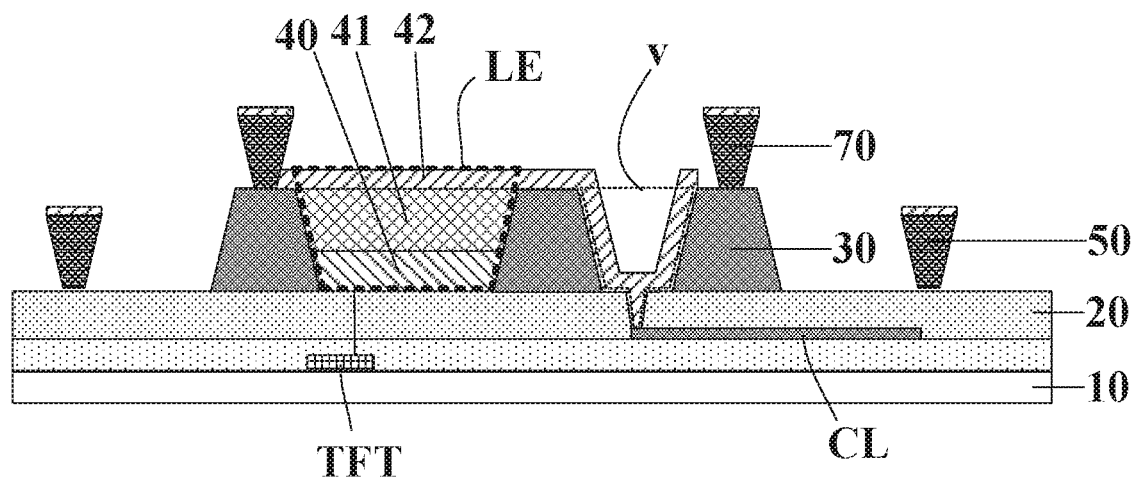

Referring to FIG. 12E, an electrode material is deposited on the base substrate 10 in an open mask process, thereby forming a second electrode 42. Due to the presence of the first barrier layer 50 and the second barrier layer 70, the second electrode 42 formed in the open mask process is separated from electrode material deposited outside an area corresponding to one or more of the plurality of light emitting elements in a respective one of the plurality of encapsulated islands. Accordingly, no patterning of the electrode material is necessary. The second electrode 42 is formed to be connected to a respective one of the plurality of connecting lines CL through the via v extending through the pixel definition layer 30 and the passivation layer 20.

Figure 12F:
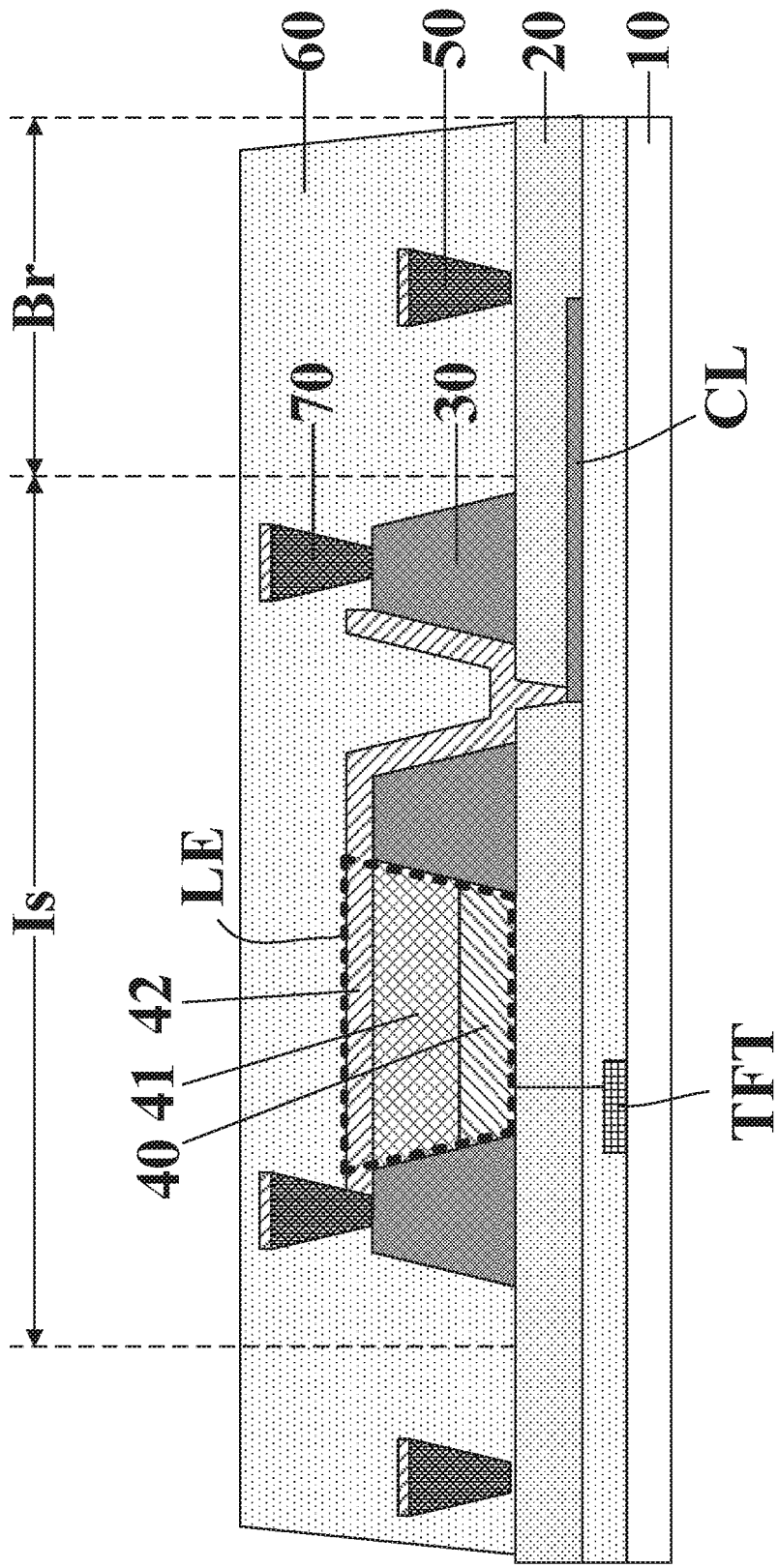

Referring to FIG. 12F, an encapsulating layer 60 is formed to encapsulate the plurality of light emitting elements LE respectively in the plurality of encapsulated islands Is. The stretchable display panel is thereby formed. In the stretchable display panel formed in the present method, the plurality of connecting lines are formed using a material different from a material of the second electrode.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A stretchable display panel having a plurality of encapsulated islands and a plurality of bridges connecting the plurality of encapsulated islands, comprising a plurality of light emitting elements, a respective one of the plurality of encapsulated islands comprising at least one of the plurality of light emitting elements encapsulated therein on a base substrate;

wherein a respective one of the plurality of light emitting elements comprises a first electrode, a light emitting layer on the first electrode, and a second electrode on a side of the light emitting layer away from the first electrode;

wherein the stretchable display panel further comprises a plurality of connecting lines connecting second electrodes of the plurality of light emitting elements respectively through the plurality of bridges; and the plurality of connecting lines comprise a material different from a material of the second electrode.

2. The stretchable display panel of claim 1, wherein the second electrode in the respective one of the plurality of light emitting elements is connected to a respective one of the plurality of connecting lines through a via extending through at least an insulating layer.

3. The stretchable display panel of claim 1, wherein the plurality of connecting lines comprises a material that is more corrosion resistant than the material of the second electrode.

4. A stretchable display apparatus, comprising the stretchable display panel of claim 1, wherein the stretchable display panel in the respective one of the plurality of encapsulated islands comprises:

the base substrate;

a passivation layer on the base substrate;

the at least one of the plurality of light emitting elements on a side of the passivation layer away from the base substrate; and an encapsulating layer encapsulating the at least one of the plurality of light emitting elements;

wherein the second electrode in the respective one of the plurality of light emitting elements is connected to a respective one of the plurality of connecting lines through a via extending through at least the passivation layer.

5. The stretchable display panel of claim 4, wherein the stretchable display panel in the respective one of the plurality of encapsulated islands further comprises a pixel definition layer defining at least one subpixel aperture;

the light emitting layer of the at least one of the plurality of light emitting elements is in the at least one subpixel aperture; and the second electrode in the respective one of the plurality of light emitting elements is connected to a respective one of the plurality of connecting lines through a via extending through the passivation layer and the pixel definition layer.

6. A stretchable display apparatus, comprising the stretchable display panel of claim 1, wherein the plurality of encapsulated islands and the plurality of bridges form a connected network; and the stretchable display panel further comprises a first barrier layer in a perimeter of the connected network.

7. The stretchable display panel of claim 6, wherein the stretchable display panel has a plurality of gaps respectively between adjacent encapsulated islands of the plurality of encapsulated islands; and a respective one of the plurality of gaps is surrounded by a portion of the first barrier layer.

8. The stretchable display panel of claim 6, wherein the first barrier layer has a first side and a second side opposing to each other, the second side being on a side of the first side away from the base substrate and having a width greater than a width of the first side.

9. The stretchable display panel of claim 1, further comprising a second barrier layer substantially surrounding an area corresponding to one or more of the plurality of light emitting elements in a respective one of the plurality of encapsulated islands.

10. The stretchable display panel of claim 9, further comprising a pixel definition layer defining a plurality of subpixel apertures;
wherein the second barrier layer is on a side of the pixel definition layer away from the base substrate.

11. The stretchable display panel of claim 9, wherein the second barrier layer has a first side and a second side opposing to each other, the second side being on a side of the first side away from the base substrate and having a width greater than a width of the first side.

12. A stretchable display apparatus, comprising the stretchable display panel of claim 1, wherein adjacent encapsulated islands in a respective one row of a plurality of rows of encapsulated islands are connected together by a respective one of the plurality of connecting lines;
the stretchable display panel further comprising a plurality of signal lines passing through a respective one of the plurality of bridges; and
the plurality of connecting lines and the plurality of signal lines are in a same layer in the respective one of the plurality of bridges.

13. A stretchable display apparatus, comprising the stretchable display panel of claim 1, wherein the plurality of connecting lines form an inter-connected network throughout the plurality of encapsulated islands and the plurality of bridges.

14. A stretchable display apparatus, comprising the stretchable display panel of claim 1, wherein the plurality of bridges are a plurality of encapsulated bridges; and the stretchable display panel further comprising an encapsulating layer encapsulating the plurality of encapsulated islands and the plurality of encapsulated bridges.

15. A stretchable display apparatus, comprising the stretchable display panel of claim 1, wherein the stretchable display panel has a plurality of gaps respectively between adjacent encapsulated islands of the plurality of encapsulated islands.

16. The stretchable display panel of claim 15, wherein the plurality of gaps are arranged as a plurality of rows of gaps and a plurality of columns of gaps;
a respective one of the plurality of rows of gaps is between two adjacent rows of encapsulated islands of the plurality of encapsulated islands;
a respective one of the plurality of columns of gaps is between two adjacent columns of encapsulated islands of the plurality of encapsulated islands;
two adjacent gaps in one row of the plurality of rows of gaps are spaced apart by a gap in a respective column of the plurality of columns of gaps; and
two adjacent gaps in one column of the plurality of columns of gaps are spaced apart by a gap in a respective row of the plurality of rows of gaps.

17. A stretchable display apparatus, comprising the stretchable display panel of claim 1, and one or more integrated circuits connected to the stretchable display panel.

* * * * *